United States Patent
Oba et al.

(10) Patent No.: US 6,342,312 B2
(45) Date of Patent: *Jan. 29, 2002

(54) CALCIUM FLUORIDE CRYSTAL, OPTICAL ARTICLE AND EXPOSURE APPARATUS FOR PHOTO-LITHOGRAPHY USING THE SAME

(75) Inventors: Tomoru Oba, Kashiwa; Toshio Ichizaki, Ibaraki-ken, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/822,938

(22) Filed: Mar. 21, 1997

(30) Foreign Application Priority Data

| Mar. 22, 1996 | (JP) | 8-066864 |
| Mar. 22, 1996 | (JP) | 8-066865 |
| Mar. 22, 1996 | (JP) | 8-066918 |
| Mar. 22, 1996 | (JP) | 8-066943 |
| Mar. 22, 1996 | (JP) | 8-093520 |

(51) Int. Cl.[7] .......................... C30B 29/12; C02B 27/00
(52) U.S. Cl. ................. 428/696; 428/469; 428/697; 117/73; 117/904; 117/940; 423/490; 423/497; 252/584; 359/385; 359/391; 359/796; 372/98; 372/101
(58) Field of Search .................... 428/688, 689, 428/697, 700, 696; 372/98, 101, 41; 252/582, 584, 588; 117/73, 76, 904, 940; 423/464, 497, 490; 359/385, 391, 796

(56) References Cited

U.S. PATENT DOCUMENTS

| 3,744,870 A | * | 7/1973 | Tomiki et al. ............... 350/1 |
| 3,981,818 A | * | 9/1976 | Swinehart et al. ........... 252/300 |
| 4,217,318 A | * | 8/1980 | Anderson ....................... 264/1 |
| 4,349,249 A | * | 9/1982 | Brixner et al. ............... 350/483 |
| 4,934,801 A | * | 6/1990 | Mercado ....................... 350/572 |
| 5,028,967 A | * | 7/1991 | Yamada et al. ............... 350/1.2 |
| 5,031,977 A | * | 7/1991 | Gibson ........................ 350/1.4 |
| 5,070,506 A | * | 12/1991 | Yanagita et al. .............. 372/40 |
| 5,289,481 A | * | 2/1994 | Xie et al. ..................... 372/39 |
| 5,471,493 A | * | 11/1995 | Mirov et al. ................... 372/42 |
| 5,478,498 A | * | 12/1995 | Kodama et al. .......... 252/301.4 |

FOREIGN PATENT DOCUMENTS

| JP | 4-349198 | 12/1992 |
| JP | 4-349199 | 12/1992 |

* cited by examiner

*Primary Examiner*—Deborah Jones
*Assistant Examiner*—Stephen Stein
(74) *Attorney, Agent, or Firm*—Fitzpatrick, Cella, Harper & Scinto

(57) ABSTRACT

A calcium fluoride crystal in which the light transparency does not deteriorate with consecutive irradiation by high output short wavelength light over long time periods. A calcium fluoride crystal in accordance with the present invention has an internal transmittance of 70% or more for light of a 135-nm wavelength or more. A calcium fluoride crystal contains any one of strontium, aluminum, silicon and magnesium, with the strontium content ranging from 1 ppm to 600 ppm, the aluminum content ranging from 1 ppm to 50 ppm, the silicon content ranging from 1 ppm to 50 ppm, or the magnesium content ranging from 1 ppm to 10 ppm. A calcium fluoride crystal has an internal transmittance of 70% or more for light of a 135-nm wavelength or more and contains 1 ppm or less of La and 10 ppm or less of Y. An optical system for an excimer laser in accordance with the present invention comprises a lens comprising any calcium fluoride crystal set forth above. An exposure apparatus for photo-lithography in accordance with the present invention comprises an optical System comprising the calcium fluoride crystal and a stage for holding a substrate to be exposed.

42 Claims, 7 Drawing Sheets

EVACUATION SYSTEM

EVACUATION SYSTEM

406

CALCIUM FLUORIDE CRYSTAL, OPTICAL ARTICLE AND EXPOSURE APPARATUS FOR PHOTO-LITHOGRAPHY USING THE SAME

BACKGROUND OF THE INVENTION

1. Field of the Invention

The present invention relates to a calcium fluoride crystal and an optical system and an apparatus using the same. In particular, the present invention relates to a calcium fluoride crystal used for an optical article which transmits excimer laser light used in exposure apparatuses for photo-lithography.

2. Description of the Related Art

Excimer lasers have attracted attention as the only high-output lasers which can oscillate in an ultraviolet region, and have been applied in electronic, chemical and energy industrial fields. In these industrial fields, the excimer laser is used for processing metal, resin, glass, ceramic and semiconductor articles as well as for chemical reactions.

The equipment for generating an excimer laser beam is known as an excimer laser oscillator. A laser gas such as Ar, Kr, Xe, $F_2$, or $Cl_2$ which is filled into a chamber is excited by electron beam irradiation or electric discharge. The excited atoms bond to atoms in a ground state to form molecules which can be present in an excited state. Such molecules are called excimers. The excimers are unstable and immediately return to the ground state, simultaneously emitting ultraviolet light. This phenomenon is referred to as bond-free transition. An excimer laser oscillator amplifies ultraviolet light formed by the bond-free transition with an optical resonator comprising a pair of mirrors and outputs it as a laser light beam.

Among excimer laser beams, the KrF laser beam (248 nm) and the ArF laser beam (193 nm) operate in a vacuum ultraviolet region, respectively. Optical articles must have high transparencies in such a region. Fluorite (calcium fluoride single-crystal) is suitable for such optical articles.

Although conventional fluorite exhibits satisfactory characteristics in general visible light optical articles, its optical characteristics deteriorate during repeated irradiation cycles of high output light having a short wavelength, such as in an excimer laser beam.

The present inventors have found that the deterioration is induced by the crystal structure and impurities.

SUMMARY OF THE INVENTION

It is an object of the present invention to provide a calcium fluoride crystal in which light transmittance characteristics do not deteriorate by consecutive irradiation of high output shortwave light over long time periods.

It is another object of the present invention to provide a calcium fluoride crystal preferably used in an excimer laser optical article, particularly, for an exposure apparatus for photo-lithography.

It is a further object of the present invention to provide a calcium fluoride crystal which can produce a highly reliable optical article.

It is still another object of the present invention to provide a calcium fluoride crystal which can be produced with low production costs.

It is still a further object of the present invention to provide an optical part for excimer lasers having a large diameter of 250 mm or more, of which optical characteristics do not deteriorate during repeated irradiation cycles of high output light having a short wavelength.

It is yet another object of the present invention to provide an exposure apparatus for photo-lithography which is capable of stably exposing fine patterns of 0.25 microns or less for long periods.

In accordance with a first aspect of the present invention, a calcium fluoride crystal has an internal transmittance of 70% or more for light of 135-nm wavelength or more.

In accordance with a second aspect of the present invention, a calcium fluoride crystal contains strontium, and the strontium content ranges from 1 ppm to 600 ppm.

The strontium content preferably ranges from 20 ppm to 400 ppm.

The internal transmittance of the calcium fluoride crystal is preferably 70% or more for light of a 135-nm wavelength or more.

In accordance with a third aspect of the present invention, an optical system for excimer lasers comprises a lens of a calcium fluoride crystal having an internal transmittance of 70% or more for light of a 135-nm wavelength or more.

In accordance with a fourth aspect of the present invention, an optical system for excimer lasers comprises a lens of a calcium fluoride crystal containing strontium, and the strontium content ranges from 1 ppm to 600 ppm.

In accordance with a fifth aspect of the present invention, an exposure apparatus for photo-lithography comprises an optical system comprising a lens of a calcium fluoride crystal having an internal transmittance of 70% or more for light of a 135-nm wavelength or more and a stage for holding a substrate being exposed.

In accordance with a sixth aspect of the present invention, an exposure apparatus for photo-lithography comprises an optical system comprising a lens of a calcium fluoride crystal containing strontium and a stage for holding a substrate being exposed, the strontium content ranging from 1 ppm to 600 ppm.

In accordance with a seventh aspect of the present invention, a calcium fluoride crystal contains aluminum, and the aluminum content is 50 ppm or less.

The aluminum content preferably ranges from 1 ppm to 50 ppm. The aluminum content more preferably ranges from 1 ppm to 5 ppm.

The internal transmittance of the calcium fluoride crystal is preferably 70% or more for light of a 135-nm wavelength or more.

In accordance with an eighth aspect of the present invention, an optical system for excimer lasers comprises a calcium fluoride crystal containing aluminum, the aluminum content being 50 ppm or less.

The internal transmittance of the calcium fluoride crystal is preferably 70% or more for light of a 135-nm wavelength or more.

In accordance with a ninth aspect of the present invention, an exposure apparatus for photo-lithography comprises an optical system comprising a lens of a calcium fluoride crystal containing aluminum and a stage for holding a substrate being exposed, the aluminum content being 50 ppm or less.

The internal transmittance of the calcium fluoride crystal is preferably 70% or more for light of a 135-nm wavelength or more.

In accordance with a tenth aspect of the present invention, a calcium fluoride crystal contains silicon, and the silicon content is 50 ppm or less.

The silicon content preferably ranges from 1 ppm to 50 ppm. The silicon content more preferably ranges from 1 ppm to 5 ppm.

The internal transmittance of the calcium fluoride crystal is preferably 70% or more for light of a 135-nm wavelength or more.

In accordance with an eleventh aspect of the present invention, an optical system for excimer lasers comprises a calcium fluoride crystal containing silicon, the silicon content being 50 ppm or less.

The internal transmittance of the calcium fluoride crystal is preferably 70% or more for light of a 135-nm wavelength or more.

In accordance with a twelfth aspect of the present invention, an exposure apparatus for photo-lithography comprises an optical system comprising a lens of a calcium fluoride crystal containing silicon and a stage for holding a substrate being exposed, the silicon content being 50 ppm or less.

The internal transmittance of the calcium fluoride crystal is preferably 70% or more for light of a 135-in wavelength or more.

In accordance with a thirteenth aspect of the present invention, a calcium fluoride crystal contains magnesium, and the magnesium contentranges from 1 ppm to 10 ppm.

The internal transmittance of the calcium fluoride crystal is preferably 70% or more for light of a 135-mm wavelength or more.

In accordance with a fourteenth aspect of the present invention, an optical system for excimer lasers comprises a calcium fluoride crystal containing magnesium, the magnesium content ranging from 1 ppm to 10 ppm.

The internal transmittance of the calcium fluoride crystal is preferably 70% or more for light of a 135-nm wavelength or more.

In accordance with a fifteenth aspect of the present invention, an exposure apparatus for photo-lithography comprises an optical system comprising a lens of a calcium fluoride crystal containing magnesium and a stage for holding a substrate being exposed, the magnesium content ranging from 1 ppm to 10 ppm.

The internal transmittance of the calcium fluoride crystal is preferably 70% or more for light of a 135-nm wavelength or more.

In accordance with a sixteenth aspect of the present invention, a calcium fluoride crystal has an internal transmittance of 70% or more for light of a 135-nm wavelength or more and contains lanthanum (La) and yttrium (Y), the lanthanum content being 1 ppm or less and the yttrium content being 10 ppm or less.

The calcium fluoride crystal may further contain at least one element selected from the group consisting of strontium (Sr), aluminum (Al), silicon (Si) and magnesium (Mg).

In accordance with a seventeenth aspect of the present invention, an optical part for excimer lasers comprises a calcium fluoride crystal having an internal transmittance of 70% or more for light of a 135-nm wavelength or more, and containing lanthanum (La) and yttrium (Y), the lanthanum content being 1 ppm or less and the yttrium content being 10 ppm or less.

In accordance with an eighteenth aspect of the present invention, an exposure apparatus for photo-lithography comprises an optical system comprising a lens of a calcium fluoride crystal having an internal transmittance of 70% or more for light of a 135-nm wavelength or more and containing lanthanum (La) and yttrium (Y), and a stage for holding a substrate being exposed, the lanthanum content being 5 ppm or less and the yttrium content being 10 ppm or less.

In accordance with a nineteenth aspect of the present invention, an exposure apparatus comprises an illuminating light source, a stage for placing an exposed member and a plurality of optical articles provided in a light optical system and/or a projection optical system, at least one of the optical article comprising a calcium fluoride crystal having an internal transmittance of 70% or more for light of a 135-nm wavelength or more.

The illuminating light source may be an excimer laser light source.

In accordance with a twentieth aspect of the present invention, a method of making a calcium fluoride crystal is characterized in that the calcium fluoride crystal has a transmittance of 70% or more for light of a 135-nm wavelength or more.

In this method, a step for mixing, melting and cooling calcium fluoride and a scavenger may be repeated at least twice.

The scavenger may be zinc fluoride, bismuth fluoride, sodium fluoride, or lithium fluoride.

The calcium fluoride crystal in accordance with the present invention can be produced at relatively low cost and used as a highly reliable optical article. Deterioration in the optical characteristics of the optical part for excimer lasers using the calcium fluoride crystal does not occur during repeated irradiation of shortwave, high-output light for long time periods. The exposure apparatus for photo-lithography can stably expose fine patterns of 0.25 microns or less for long time periods.

Further objects, features and advantages of the present invention will become apparent from the following description of the preferred embodiments with reference to the attached drawings.

DETAILED DESCRIPTION OF THE PREFERRED EMBODIMENTS

First Embodiment

Various calcium fluoride crystals were produced under different production conditions in the present invention, and subjected to KrF and ArF excimer laser irradiation for long time periods to evaluate optical characteristics. Some calcium fluoride crystals having excellent characteristics were shaped into an optical disk article having a thickness of 10 mm and subjected to excimer laser irradiation.

Some calcium fluoride crystals were colored by $1\times10^4$ cycles of laser pulse irradiation with an output power of 30 mJ/cm$^2$ and 1-hour γ-ray irradiation at $1\times10^4$ R/H. Both colored and non-colored samples exhibited the same absorbance or transmittance of 248-nm or 193-nm light, which is the wavelength of an excimer laser. Thus, the initial transmittance of such a wavelength cannot be used as a standard to select durable products, because the initial transmittance does not suggest future deterioration in use.

The present inventors have found as a result of analysis of products not deteriorated by the test set forth above that the transmittance of 135-nm wavelength light can be used as a standard to select durable products. When a calcium fluoride optical article having a transmittance of 70% or more for light of a 135-nm wavelength or more, regardless of laser and/or γ-ray irradiation, was used in an excimer laser optical system, the optical system could stably emit laser light.

Figure 1:
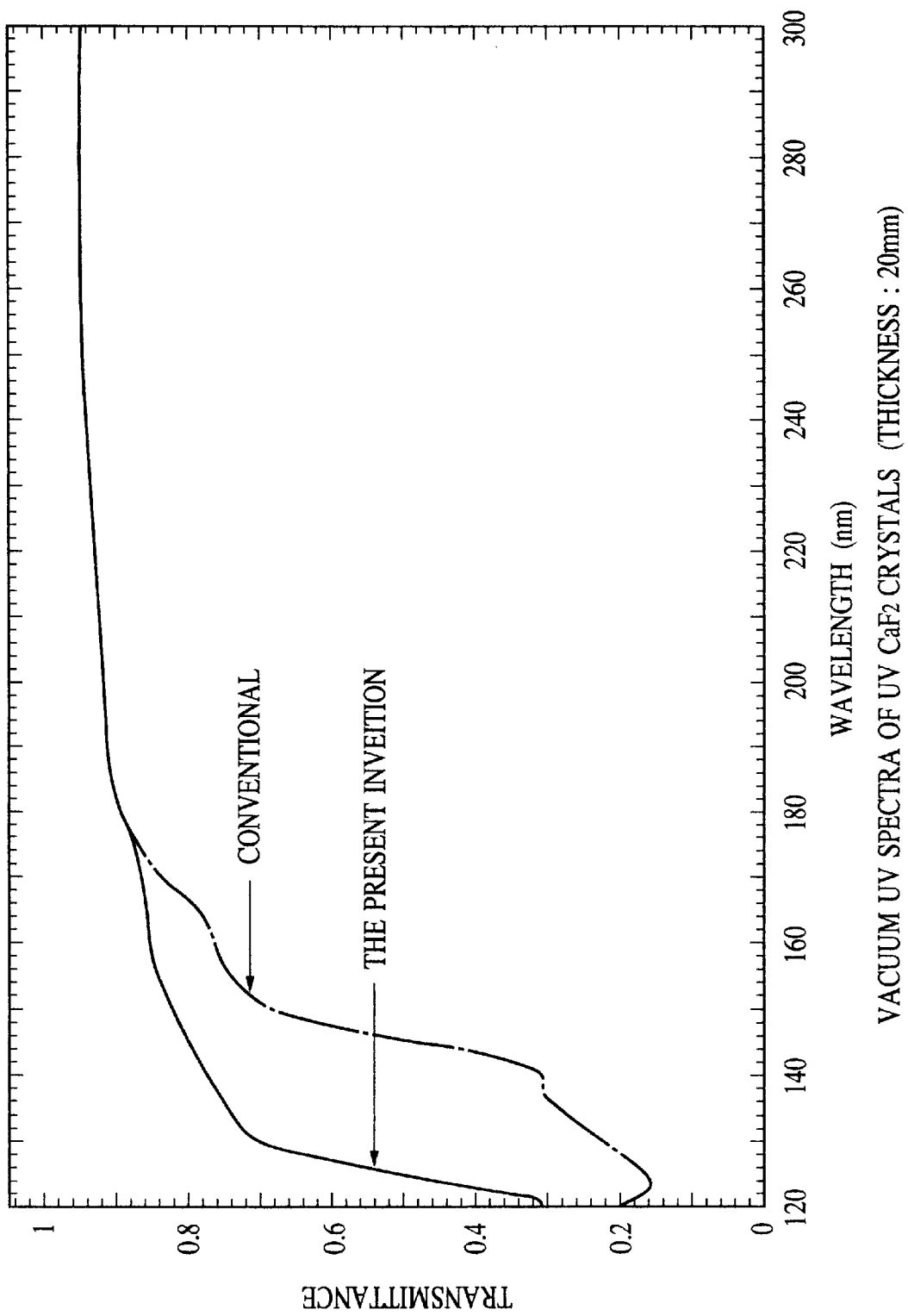
FIG. 1 is a graph illustrating transmittance characteristics of a calcium fluoride crystal in accordance with the present invention.

FIG. 1 is a graph illustrating vacuum ultraviolet transmittance characteristics of a calcium fluoride crystal having a thickness of 20 mm in accordance with the present invention, as well as a conventional calcium fluoride crystal having the same thickness for comparison, in which the horizontal axis indicates wavelength and the vertical axis indicates transmittance. The number 1 of the vertical axis indicates 100% transmittance whereas the number 0 indicates 0% transmittance. FIG. 1 demonstrates that the transmittance of light of a 135-nm wavelength or more is 70% or more in the calcium fluoride crystal in accordance with the present invention whereas it is approximately 30% in the conventional calcium fluoride crystal. A calcium fluoride crystal having a high transmittance of vacuum ultraviolet light exhibits high durability against ArF or KrF excimer laser light.

Further, it is found as a result of elemental analysis that calcium fluoride crystals having excellent optical characteristics contain strontium (Sr). The strontium content of a calcium fluoride crystal having excellent optical characteristics ranges from 1 ppm to 600 ppm, and preferably 20 to 400 ppm. A strontium content over the upper limit results in a disordered crystal structure. On the other hand, when the strontium content is less than the lower limit, optical characteristics will deteriorate due to other impurities.

The calcium fluoride crystal in accordance with the present invention has an etch pit density of $1\times10^5$ or less and a high quality crystal structure.

Results of elemental analysis of calcium fluoride crystals having excellent optical characteristics demonstrate that calcium fluoride crystals containing magnesium (Mg) also have excellent optical characteristics. The magnesium content of a calcium fluoride crystal having excellent optical characteristics ranges from 1 ppm to 10 ppm, and preferably 1 to 6 ppm. A magnesium content of over the upper limit results in a disordered crystal structure. On the other hand, when the magnesium content is less than the lower limit, optical characteristics will deteriorate due to other impurities.

The calcium fluoride crystal in accordance with the present invention has an etch pit density of $1\times10^5$ or less and a high quality crystal structure.

Figure 2:
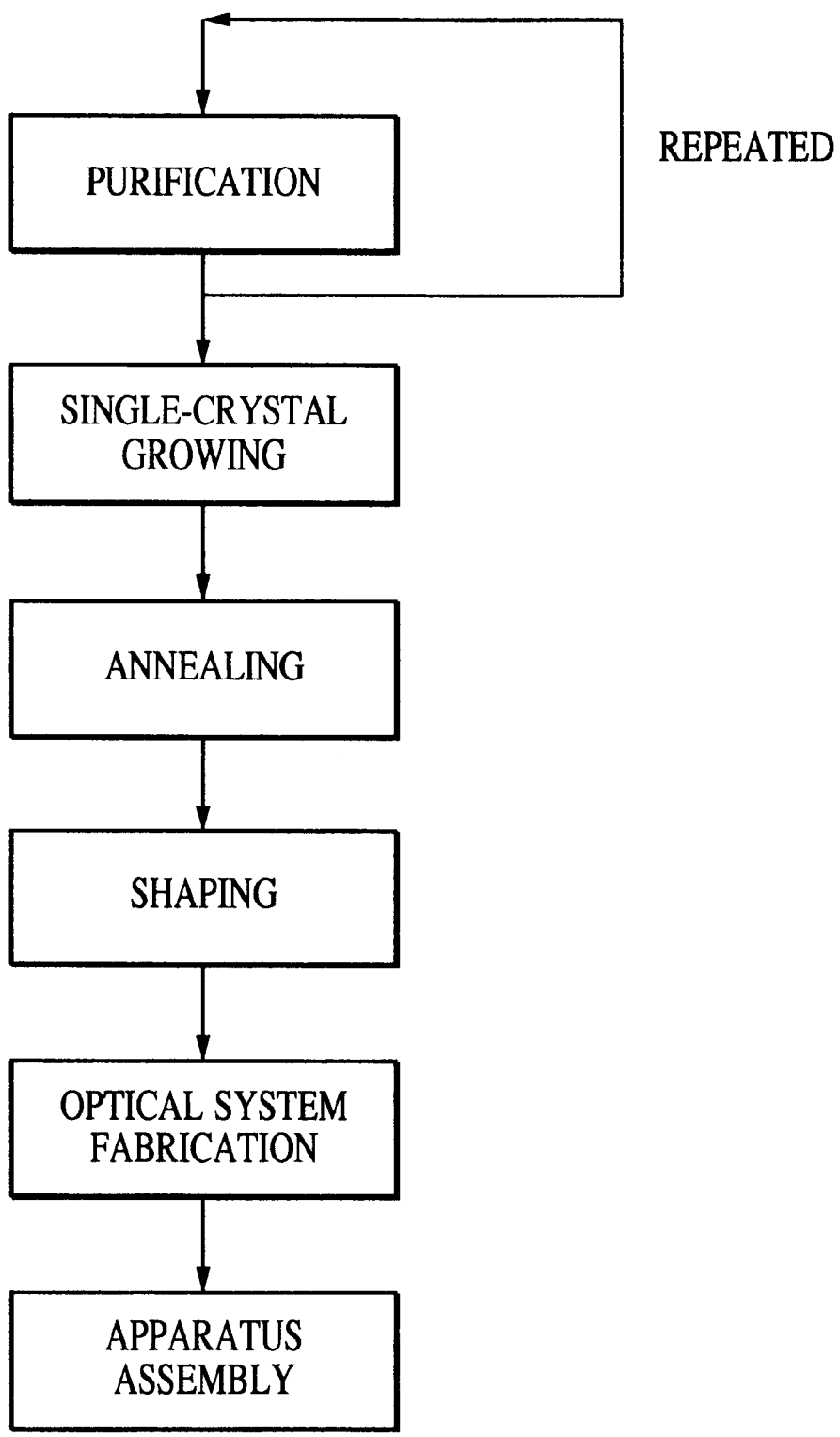
FIG. 2 is a flow chart illustrating a production process of an exposure apparatus fabrication.
Figure 3:
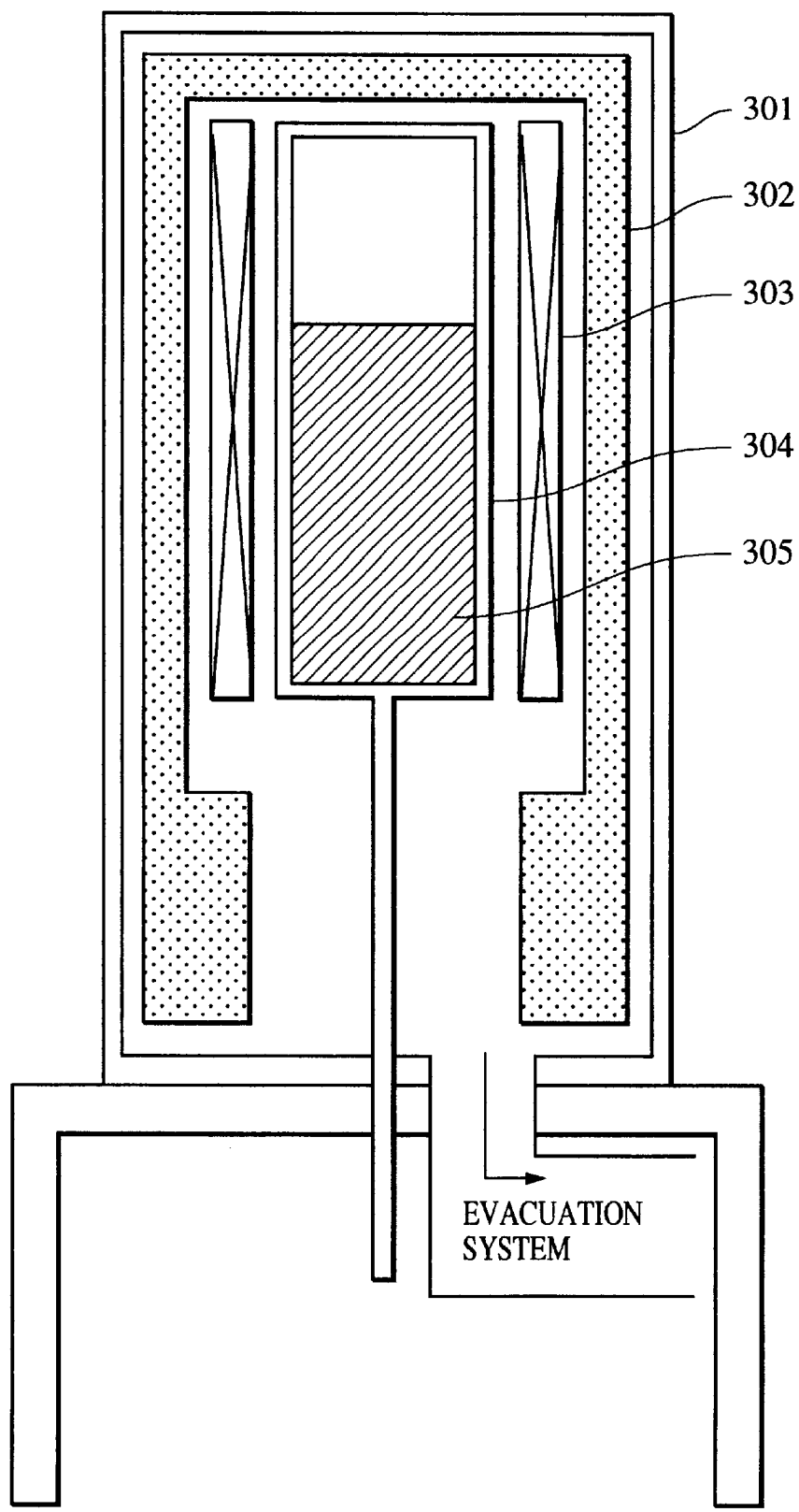
FIG. 3 is a cross-sectional view of a purification apparatus.
Figure 4:
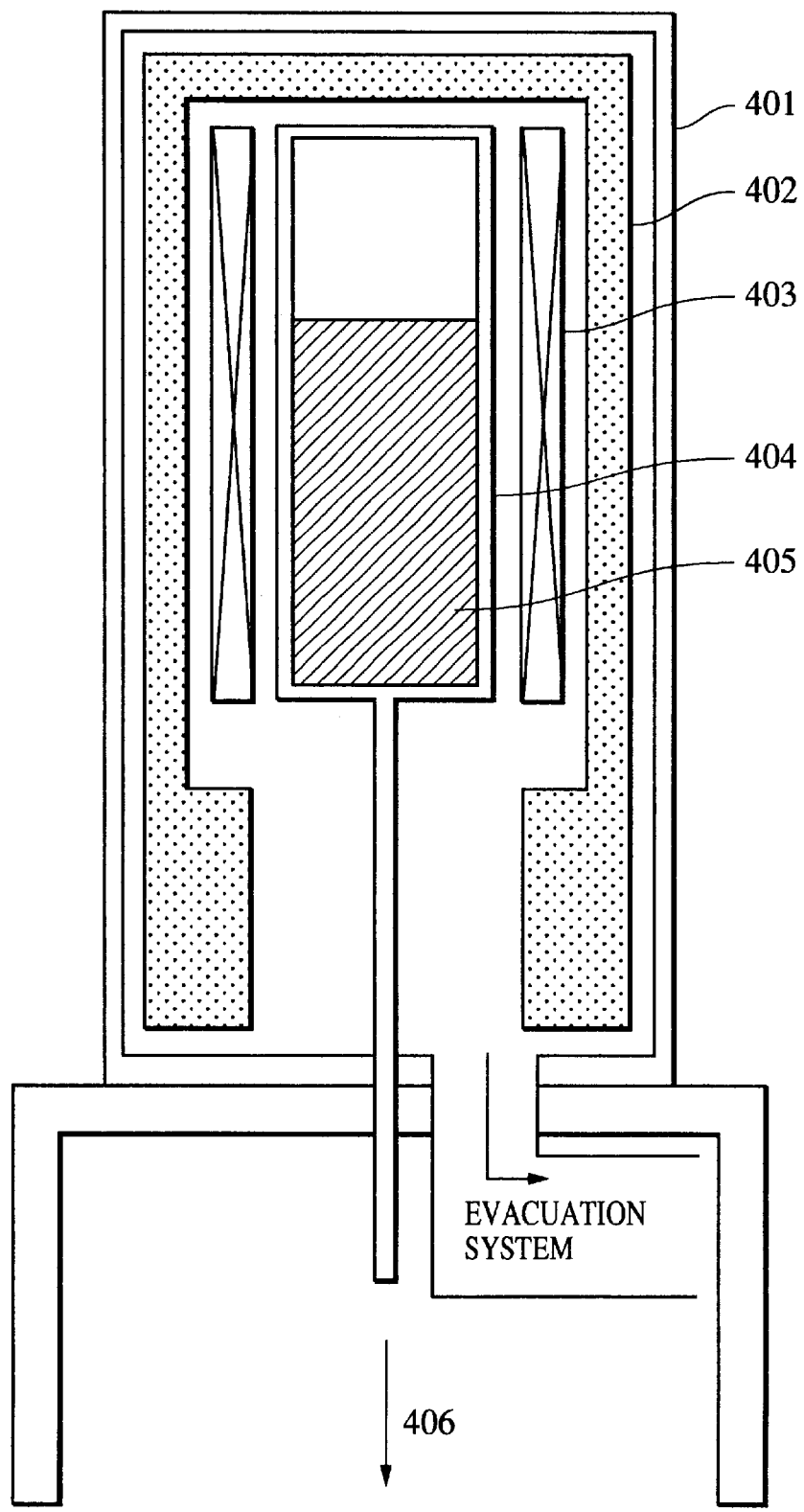
FIG. 4 is a cross-sectional view of a growing furnace used in a single-crystal growing step.
Figure 6:
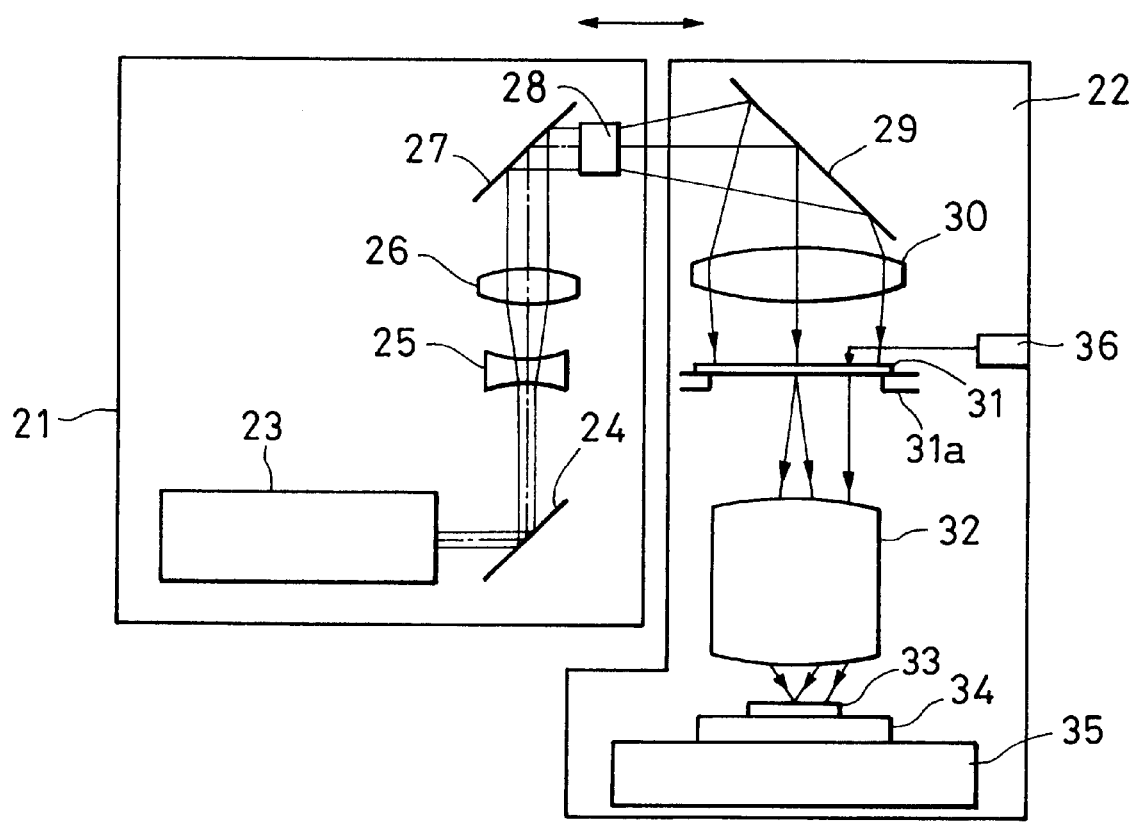
FIG. 6 is a schematic diagram illustrating an exposure apparatus in accordance with the present invention.

FIG. 2 is a flow chart for illustrating a production process of a calcium fluoride crystal used in the present invention. FIG. 3 is a schematic cross-sectional view of a purification apparatus used in the purification step, which comprises a purification furnace chambr 301, heat insulating material 302, a heater 303, and a crucible 304 for purifying calcium fluoride 305. FIG. 4 is a schematic cross-sectional view of a growing furnace used in the growing step, which comprises a growing furnace chamber 401, a heat insulating material 402, a heater 403, a crucible 404 for growing calcium fluoride crystal 405, and a crucible lowering mechanism 406. FIG. 6 is a schematic cross-sectional view of an annealing furnace used in the annealing step, which comprises an annealing furnace chamber 501, a heat insulating material 502, a heater 503, and a crucible 504 for annealing calcium fluoride crystal 505.

A preferable production process in accordance with the present invention will now be illustrated with reference to these drawings.

Raw calcium fluoride powder and a scavenger are mixed. Mixing is preferably performed by rotation of a container filled with calcium fluoride and the scavenger. Examples of preferable scavengers include zinc fluoride, bismuth fluoride, sodium fluoride and lithium fluoride, which have higher reactivities with oxygen than a fluoride crystal which is grown. The scavenger reacts with oxides contained in the raw synthesized fluoride to form more volatile oxides. Among these fluorides, zinc fluoride is preferable.

For example, a zinc fluoride scavenger can convert calcium oxide formed in the presence of water into calcium fluoride as shown in the following equations:

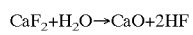

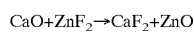

The amount of the scavenger preferably ranges from 0.05 mol % to 5.00 mol %, and more preferably from 0.1 mol % to 1.0 mol % of the calcium fluoride. The formed ZnO can be ejected in a high temperature atmosphere in each production step.

(Purification Step)

The mixture of calcium fluoride powder and a scavenger is melted in the crucible in the purification furnace set forth in FIG. 3 by energizing the heater. The calcium fluoride melt is gradually cooled while lowering the crucible to grow a crystal. Unlike the single-crystal growing step set forth below, no strict temperature control is required in this step. Thus, the formed fluoride crystal may have crystal grain boundaries. The surface layer of the fluoride crystal, i.e., the section crystallizing last, is removed, since impurities adversely affecting optical characteristics are concentrated in this section. The resulting crystal is placed into the crucible again to repeat several times a series of operations including melting, crystallization and impurity removal.

(Growing Step)

The purified fluoride crystal is transferred to the crucible 404 with strontium fluoride (SrF$_2$). The amount of strontium fluoride is adjusted so that the strontium content in the calcium fluoride crystal is within a range specified above. After the fluoride crystal is melted by heating the crucible 404 to a temperature of 1,390 to 1,450° C., the crucible 404 is lowered at a rate of 0.1 to 5.0 mm/hour to gradually cool the melt.

(Annealing Step)

Figure 5:
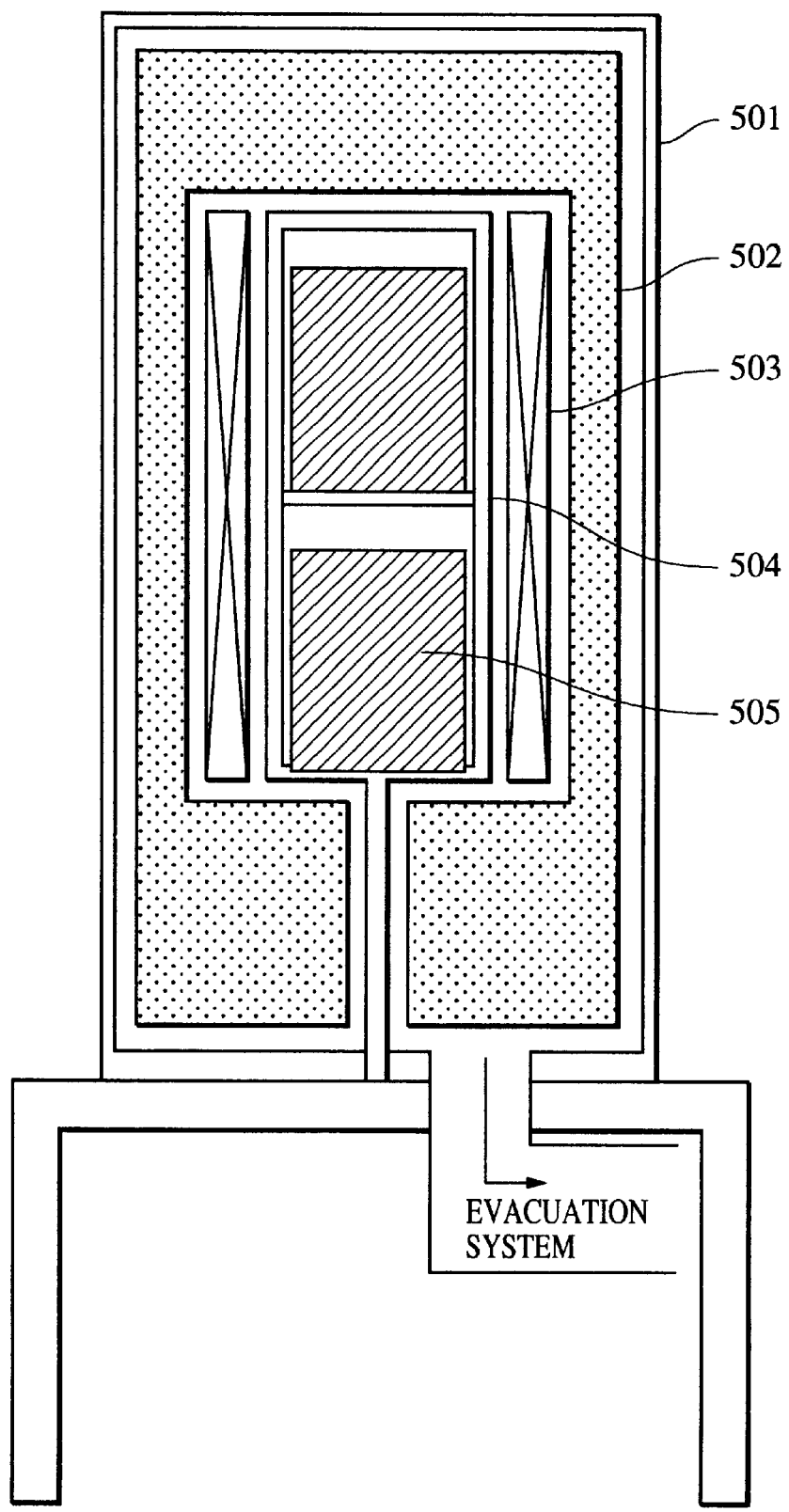
FIG. 5 is a cross-sectional view of a growing furnace used in an annealing step.

The grown fluoride single-crystal is annealed in the annealing furnace set forth in FIG. 5 by heating the single-crystal to 900 to 1,000° C. It is preferred that the annealing be performed for 20 hours or more, and more preferably for 20 to 30 hours.

In this production method, the bulk density does not change substantially before and after crystal growth, and a high packing density of the fluoride crystal can be achieved in the crystal growing furnace.

In this production method, the bulk density does not change substantially before and after crystal growth, and a high packing density of the fluoride crystal can be achieved in the crystal growing furnace.

The resulting fluoride single-crystal contains reduced impurities of no greater than 10 ppm of, for example, water, iron (Fe), nickel (Ni) and chromium (Cr) and contains 1 to 600 ppm of Sr.

The transmittances of the resulting calcium fluoride crystals are measured to select only those having transmittances of 70% or more for light of a 135-nm wavelength or more. An optical article is made from the selected calcium fluoride crystal.

(Shaping & Additional Treatment Step)

The calcium fluoride single-crystal is shaped into desired optical articles, e.g., concave lenses, convex lenses, disks and plates. Antireflection coatings may be provided on the surfaces of the fluoride optical articles according to demand. Preferable examples of antireflection coating materials include magnesium fluoride, aluminum oxide and tantalum oxide. These antireflection coatings can be deposited on the optical articles by resistive heating deposition, electron beam deposition or sputtering. The optical articles obtained with the method in accordance with the present invention do not substantially contain water and have excellent adhesiveness to antireflection coatings.

(Optical System & Apparatus Fabricating Step)

An optical system suitable for excimer lasers and, in particular, ArF excimer lasers can be provided by combining the various lenses obtained. A combination of an excimer laser light source, an optical system having lenses of calcium fluoride and a stage for moving a substrate provides an exposure apparatus for photo-lithography. As excimer laser light is irradiated to a light sensitive resist on a substrate through a reticle pattern using the exposure apparatus, a latent image corresponding to the reticle pattern forms on the resist.

The strontium content in the calcium fluoride crystal may be controlled by another method as follows: A raw calcium fluoride powder containing a large amount of strontium fluoride is prepared and mixed with the synthesized calcium fluoride powder in an appropriate ratio. The purification step set forth above is repeated until a desired strontium content is achieved. The strontium content may be determined by fluorescent X-ray spectrometry, ICP emission spectrometry, or ICP mass spectrometry.

(Exposure Apparatus)

An exposure apparatus using an optical article in accordance with the present invention will now be illustrated.

Examples of exposure apparatuses include reducing projection exposure apparatuses and life-size lens exposure apparatuses. A preferable exposure apparatus for exposing an entire wafer is a stepper of a step-and-repeat system which exposes a field in the wafer and then moves the wafer to expose the adjacent field. A micro-scanning exposure apparatus is also preferably used.

FIG. 6 is a schematic view of an exposure apparatus configuration in accordance with the present invention. The exposure apparatus comprises an illuminating light source section 21 and an exposure mechanism section 22, which are separable from each other. The illuminating light source section has a high-output illuminating light source 23 such as an excimer laser, a mirror 24, a concave lens 25, and a convex lens 26. The concave and convex lenses 25 and 26 act as an expander and expand the laser beam to almost the size of an optical integrator 28 which is provided for uniformly illuminating a reticle. A mirror 27 is provided between the convex lens 25 and the optical integrator 28. The exposure mechanism section 22 has a mirror 29 and a condenser lens for collimating the light beam from the optical integrator 28. The exposure mechanism section 22 further has a reticle 31 in which a circuit pattern is pictured, and a reticle holder 31a which holds the reticle 31 by suction fixation, a projection optical system 32 for projecting the reticle pattern, and a wafer 33. The reticle pattern projected through the projection optical system 32 is printed on the wafer 33. The wafer 33 is held on an XY stage 34 by suction fixation and stepwise transferred at every printing along the XY directions on a table 35. An alignment means 36 is provided in the exposure mechanism section 22 for performing TTL alignment. A typical exposure apparatus is also provided with an autofocus mechanism and a wafer transfer mechanism in the exposure mechanism section 22.

Figure 7:
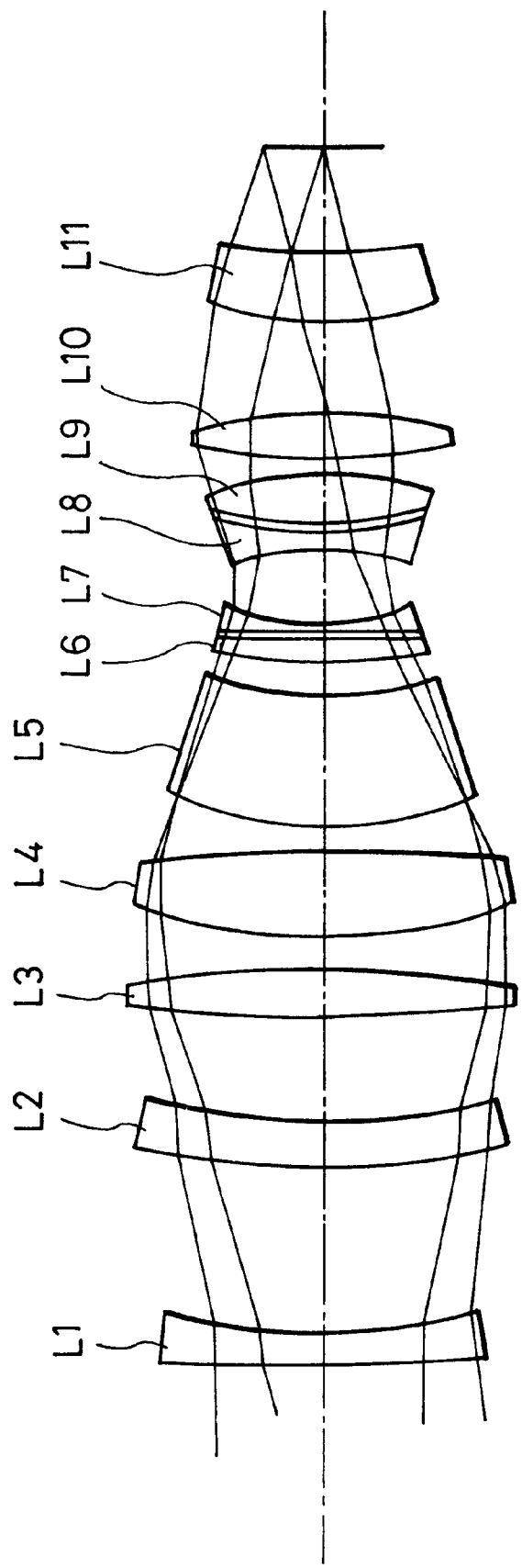
FIG. 7 is a schematic cross-sectional view of an embodiment of an optical article used in an exposure apparatus in accordance with the present invention.

FIG. 7 is a schematic cross-sectional view of a lens assembly used in the projection optical system of the exposure apparatus set forth in FIG. 6 as an embodiment of an optical article in accordance with the present invention. The lens assembly consists of 11 lenses $L_1$ through $L_{11}$ which are separately arranged. The calcium fluoride optical article in accordance with the present invention can be used as lenses and mirrors set forth in FIGS. 4 and 5, and as mirrors and lenses of a mirror-type exposure apparatus. It is preferable that surfaces of these mirrors and lenses be coated with antireflection films or reflection-enhanced films.

When a calcium fluoride crystal containing a specified amount of magnesium is produced, magnesium fluoride ($MgF_2$) is used instead of $SrF_2$ in the growing step set forth above. The resulting fluoride single-crystal contains no greater than 25 ppm of oxygen, reduced amounts of impurities, such as water, iron (Fe), nickel (Ni) and chromium (Cr), and 1 to 10 ppm of magnesium (Mg). The transmittances of the resulting calcium fluoride crystals are measured to select only those having transmittances of 70% or more for light of a 135-nm wavelength or more. An optical article is made from the selected calcium fluoride crystal.

The calcium fluoride single-crystal is shaped into desired optical articles, e.g., concave lenses, convex lenses, disks and plates. Antireflection coatings may be provided on the surfaces of the fluoride optical articles according to demand. Preferable examples of antireflection coating materials include magnesium fluoride, aluminum oxide and tantalum oxide. These antireflection coatings can be deposited on the optical articles by resistive heating deposition, electron beam deposition or sputtering. The optical articles obtained by the method in accordance with the present invention do not substantially contain water and have excellent adhesiveness to antireflection coatings.

An optical system suitable, as set forth in FIG. 7, for excimer lasers and in particular ArF excimer lasers can be provided by combining the various lenses obtained (optical system fabricating step). A combination of an excimer laser light source, an optical system having lenses of calcium fluoride and a stage for moving a substrate provides an exposure apparatus for photo-lithography, as set forth in FIG. 6 (apparatus fabricating step). As excimer laser light is irradiated to a light sensitive resiston a substrate through a reticle pattern using the exposure apparatus, a latent image corresponding to the reticle pattern forms on the resist.

The magnesium content in the calcium fluoride crystal may be controlled by another method as follows: A raw calcium fluoride powder containing a large amount of magnesium fluoride is prepared, and mixed with the synthesized calcium fluoride powder in an appropriate ratio. The purification step set forth above is repeated until a desired magnesium content is achieved. The magnesium content maybe determined by fluorescent X-ray spectrometry, ICP Gssion spectrometry, or ICP mass spectrometry. The internal transmittance of a 135-nm wavelength light can be determined with a vacuum ultraviolet spectrometer.

Second Embodiment

Some kinds of impurities, which are contained in calcium fluoride crystal in trace amounts, may improve optical characteristics of the calcium fluoride crystal compared to a calcium fluoride crystal not containing such impurities. An example of such impurities is aluminum. However, a large amount of aluminum in the calcium fluoride crystal causer aluminum oxide formation, e.g., $Al_2O_3$, and the included oxygen inhibits improvement in optical characteristics of the calcium fluoride crystal. On the other hand, when the aluminum content is extremely low, excessive amounts of transition metals adversely affecting optical characteristics tend to remain in the calcium fluoride crystal. Thus, the preferable aluminum content ranges from 1 ppm to 50 ppm and more preferably from 1 ppm to 5 ppm. A calcium fluoride crystal containing the above-specified amount of aluminum exhibits the high transmittance set forth above. Further, the oxygen content can be limited to 25 ppm or less and the transition metal content can be limited to 1 ppm or less.

In the present invention, the contents of impurities adversely affecting optical characteristics, e.g., oxygen, transition metals and water, can be decreased without excessive repetition of the purification step, and the resulting calcium fluoride crystal has a high transmittance for light of a 135-nm wavelength or more.

There are some impurities other than aluminum which improve optical characteristics when they are present in trace amounts in the calcium fluoride crystal. One example of such impurities is silicon. However, a large amount of silicon includes oxygen as silicon oxide, e.g., $SiO_2$, in the calcium fluoride crystal and inhibits improvement in optical characteristics of the calcium fluoride crystal. On the other hand, an extremely low silicon content results in excessive amounts of transition metal inclusion which adversely affects optical characteristics. A preferable silicon content ranges from 1 ppm to 50 ppm and more preferably from 1 ppm to 5 ppm. A calcium fluoride crystal containing an above-specified amount of silicon exhibits high transmittance as set forth above. Further, the oxygen content can be limited to 25 ppm or less and the transition metal content can be limited to 1 ppm or less.

In the present invention, the contents of impurities adversely affecting optical characteristics, e.g., oxygen, transition metals and water, can be decreased without excessive repetition of the purification step, with the resulting calcium fluoride crystal having a high transmittance for light of a 135-nm wavelength or more.

The production process of the exposure apparatus in the second embodiment is the same as the flow chart set forth in FIG. 2.

Raw calcium fluoride powder and a scavenger are mixed. Mixing is preferably performed by rotation of a container filled with calcium fluoride and the scavenger. Examples of preferable scavengers include zinc fluoride, bismuth fluoride, sodium fluoride and lithium fluoride, which have higher reactivities with oxygen than the fluoride crystal which is grown. The scavenger reacts with oxides contained in the raw synthesized fluoride to form more volatile oxides. Among these fluorides, zinc fluoride is preferable.

For example, a zinc fluoride scavenger can convert calcium oxide formed in the presence of water into calcium fluoride as shown in the following equations:

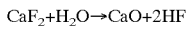

$$CaF_2+H_2O \rightarrow CaO+2HF$$

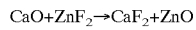

$$CaO+ZnF_2 \rightarrow CaF_2+ZnO$$

The amount of the scavenger preferably ranges from 0.05 mol % to 5.00 mol %, and more preferably from 0.1 mol % to 1.0 mol % of the calcium fluoride. The formed ZnO can be ejected in a high temperature atmosphere in each production step.

The mixture of calcium fluoride powder and a scavenger is melted in the crucible in the purification furnace set forth in FIG. 3 by energizing the heater (purification step). The calcium fluoride melt is gradually cooled while lowering the crucible to grow a crystal. Unlike the single-crystal growing step set forth below, no strict temperature control is required in this step. Thus, the formed fluoride crystal may have crystal grain boundaries. The surface layer of the fluoride crystal, i.e., the section crystallizing last, is removed, since impurities adversely affecting optical characteristics are concentrated in this section. The resulting crystal is placed into the crucible again to repeat a series of operations including melting, crystallization and impurity removal several times.

The purified fluoride crystal is transferred to the crucible 404 set forth in FIG. 4 with aluminum fluoride ($AlF_3$) or silicon (Si). The amount of aluminum fluoride is adjusted so that the aluminum content in the calcium fluoride crystal is within a range specified above. After the fluoride crystal is melted by heating the crucible to a temperature of 1,390 to 1,450° C., the crucible is lowered at a rate of 0.1 to 5.0 mm/hour to gradually cool the melt.

The grown fluoride single-crystal is annealed in the annealing furnace set forth in FIG. 5 by heating the single-crystal at 900 to 1,000° C. (annealing step). It is preferred that the annealing be performed for 20 hours or more, and more preferably 20 to 30 hours.

The resulting fluoride single-crystal contains 25 ppm or less of oxygen, and reduced impurities, for example, water, iron (Fe), nickel (Ni) and chromium (Cr).

The transmittances of the resulting calcium fluoride crystals are measured to select only those having transmittances of 70% or more for light of a 135-nm wavelength or more. An optical article is made from the selected calcium fluoride crystal.

The calcium fluoride single-crystal is shaped, into desired optical articles, e.g., concave lenses, convex lenses, disks and plates (shaping step). Antireflection coatings may be provided on the surfaces of the fluoride optical articles according to demand. Preferable examples of antireflection coating materials include magnesium fluoride, aluminum oxide and tantalum oxide. These antireflection coatings can be deposited on the optical articles by resistive heating deposition, electron beam deposition or sputtering. The optical articles obtained by the method in accordance with the present invention do not substantially contain water and have excellent adhesiveness to antireflection coatings.

An optical system suitable for excimer lasers and in particular ArF excimer lasers, as set forth in FIG. 7, can be provided by combining the various lenses obtained (optical system fabrication step). A combination of an excimer laser light source, an optical system having lenses of calcium fluoride and a stage for moving a substrate provides an exposure apparatus for photo-lithography as set forth in FIG. 6 (apparatus assembly step). As excimer laser light is irradiated to a light sensitive resist on a substrate through a reticle pattern using the exposure apparatus, a latent image corresponding to the reticle pattern forms on the resist.

The aluminum content in the calcium fluoride crystal may be controlled by another method as follows: A raw calcium fluoride powder containing a large amount of aluminum is prepared, and mixed with the synthesized calcium fluoride powder in an appropriate ratio. The purification step set forth above is repeated until a desired aluminum content is achieved. The aluminum content may be determined by fluorescent X-ray spectrometry, ICP emission spectrometry, or ICP mass spectrometry. The internal transmittance of light of a 135-nm wavelength or more can be determined with a vacuum ultraviolet spectrometer.

Third Embodiment

Contents of specified elements other than the elements set forth above must be limited to predetermined amounts in order to further enhance the crystallinity. Such specified elements include La and Y, and La and Y contents are preferably 1 ppm or less, and 10 ppm or less, respectively. By limiting the La and Y contents, durability of the excimer laser improves, the calcium fluoride crystal is prevented from coloring and the etch pit density (EPD) is reduced to $10^4$ or less. Further, the calcium fluoride crystal is more durable to heat with low distortion.

At the present stage, a number of repetitions of the purification step before the single-crystal growing step is one of essential conditions for obtaining the calcium fluoride crystal having the excellent characteristics set forth above. However, such repetition of the purification step increases the calcium fluoride crystal production time and thus inhibits the decrease in the production cost.

Some kinds of impurities improve calcium fluoride crystal characteristics when they are included in trace amounts compared with when they are not included. Examples of allowable impurities in the calcium fluoride crystal include strontium, aluminum, silicon and magnesium. However, excessive amounts of impurities form their oxides in the calcium fluoride crystal and the included oxygen inhibits the improvement in the calcium fluoride crystal characteristics. On the other hand, if their contents are significantly low, the calcium fluoride crystal tends to include undesirable amounts of other transition elements, which deteriorate the optical characteristics. Thus, the preferable contents are 1 to 600 ppm for strontium, 1 to 50 ppm for aluminum, 1 to 50 ppm for silicon, and 1 to 10 ppm for magnesium, when strontium, aluminum, silicon and magnesium contents are controlled within the ranges set forth above, the oxygen content can be limited to 25 ppm or less, and the transition metal contents other than Y and La can be reduced.

In accordance with the present invention, as set forth above, the contents of impurities adversely affecting optical characteristics, e.g., oxygen, carbon and water, can be suppressed, and the calcium fluoride crystal has a high transmittance for light of a 135-nm wavelength or more being 75% or more.

A preferable production process in accordance with the present invention will be illustrated with reference to the drawings. The production process until the exposure apparatus assembly in this embodiment is illustrated in FIG. 2.

Fluorite ore or synthesized raw calcium fluoride is prepared. Raw calcium fluoride powder and a scavenger are mixed. Mixing is preferably performed by rotation of a container filled with calcium fluoride and the scavenger. Examples of preferable scavengers include zinc fluoride, bismuth fluoride, sodium fluoride and lithium fluoride, which have higher reactivities with oxygen than the fluoride crystal which is grown. The scavenger reacts with oxides contained in the raw synthesized fluoride to form more volatile oxides. Among these fluorides, zinc fluoride is preferable.

For example, a zinc fluoride scavenger can convert calcium oxide formed in the presence of water into calcium fluoride as shown in the following equations:

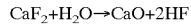

$$CaF_2 + H_2O \rightarrow CaO + 2HF$$

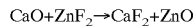

$$CaO + ZnF_2 \rightarrow CaF_2 + ZnO$$

The amount of the scavenger preferably ranges from 0.05 mol % to 5.00 mol %, and more preferably from 0.1 mol % to 1.0 mol % of the calcium fluoride. The formed ZnO can be ejected in a high temperature atmosphere in each production step.

The mixture of calcium fluoride powder and a scavenger is melted in the crucible in the purification furnace set forth in FIG. 3 by energizing the heater. The calcium fluoride melt is gradually cooled while lowering the crucible to grow a crystal (purification step). Unlike the single-crystal growing step set forth below, no strict temperature control is required in this step. Thus, the formed fluoride crystal may have crystal grain boundaries. The surface layer of the fluoride crystal, i.e., the section crystallizing last, is removed, since impurities adversely affecting optical characteristics are concentrated in this section. The resulting crystal is placed into the crucible again to repeat a series of operations including melting, crystallization and impurity removal several times.

The crucible is heated to a temperature of 1,390 to 1,450° C. to melt the crystal, and the crucible is lowered at a rate of 0.1 to 5.0 mm/hour to partially cool the melt. A single-crystal can be obtained in such a manner.

The grown fluoride single-crystal is annealed in the annealing furnace set forth in FIG. 5 (annealing step). In the annealing step, the crucible is heated at 900 to 1,000° C. It is preferred that the annealing be performed for 20 hours or more, and more preferably 20 to 30 hours.

In this production method, the bulk density does not change substantially before and after crystal growth, and a high packing density of the fluoride crystal can be achieved in the crystal growing furnace.

The transmittances of the resulting single-crystal fluorides are measured to select only those having transmittances of 70% or more for light of a 135-nm wavelength or more. An optical article is made from the selected calcium fluoride crystal.

The calcium fluoride single-crystal is shaped into desired optical articles, e.g., concave lenses, convex lenses, disks and plates (shaping step). Antireflection coatings may be provided on the surfaces of the fluoride optical articles according to demand. Preferable examples of antireflection coating materials include magnesium fluoride, silicon oxide and tantalum oxide. These antireflection coatings can be deposited on the optical articles by resistive heating deposition, electron beam deposition or sputtering. The optical articles obtained by the method in accordance with the present invention do not substantially contain water and have excellent adhesiveness to antireflection coatings.

An optical system suitable for excimer lasers and in particular ArF excimer lasers, as set forth in FIG. 7, can be provided by combining the various lenses obtained (optical system fabrication step). A combination of an excimer laser light source, an optical system having lenses of calcium fluoride and a stage for moving a substrate provides an exposure apparatus for photo-lithography as set forth in FIG.

6 (apparatus assembly step). As excimer laser light is irradiated to a light sensitive resist on a substrate through a reticle pattern using the exposure apparatus, a latent image corresponding to the reticle pattern forms on the resist.

The lanthanum and yttrium contents may be determined by fluorescent X-ray spectrometry, ICP emission spectrometry, or ICP mass spectrometry. The internal transmittance of light of a 135-nm wavelength or more can be determined with a vacuum ultraviolet spectrometer.

EXAMPLE 1

Calcium fluoride powder was prepared by the reaction of calcium carbonate with hydrofluoric acid. The prepared calcium fluoride was mixed with zinc fluoride ($ZnF_2$) as a scavenger in an amount of 0.7 wt % of the calcium fluoride. The mixture was heated to 1,390 to 1,450° C. in the crucible in the purification furnace set forth in FIG. 3, and gradually cooled by lowering the crucible to crystallize, the melt. The top layer of the calcium fluoride crystal was removed by several millimeters. The heating, slow cooling and removing steps were repeated a number of times to prepare various calcium fluoride crystal blocks having been heated, cooled and purified a different number of times.

Each block was placed into the crucible in the single-crystal growing furnace set forth in FIG. 4, and 0.1 wt % of $ZnF_2$ was added. The crucible was heated to 1,390 to 1,450° C. while the furnace was evacuated to $6 \times 10^{-4}$ Torr or less until the fluoride mixture was melted. Then, the crucible was further evacuated to $2 \times 10^{-6}$ Torr or less at a temperature of 1,390 to 1,450° C. for 11 hours. The crucible was lowered at a rate of 2 nm/hour. The crucible was cooled at a cooling rate of approximately 100° C./min thereby.

The calcium fluoride single-crystal was placed into the crucible in the annealing furnace set forth in FIG. 5 with 0.1 wt % of $ZnF_2$. The annealing furnace was heated from room temperature to 900° C. at a heating rate of 100° C./min. while evacuating the furnace, maintained at 900° C. for 20 hours, and cooled to room temperature at a cooling rate of 6° C./min.

The internal transmittance of the resulting calcium fluoride crystal was determined using a 135-nm wavelength light. Coloring of the calcium fluoride crystal was observed.

After $1 \times 10^4$ pulses of laser beam irradiation with an output power of 30 ml/$cm^2$ and 1-hour of γ-ray irradiation at $1 \times 10^4$ R/H, the decreased transmittances for 193 and 248 nm wavelength light were determined by coloring observation. Coloring after $10^6$ and $10^7$ pulses of laser irradiation was also observed. Results are shown in Table 1.

TABLE 1

| Sample No. | Internal Transmittance | Coloring ($10^4$) | Decreased Transmittance | Coloring ($10^6$) | Coloring ($10^7$) |
| --- | --- | --- | --- | --- | --- |
| 1 | 65% | observed | 2% | observed | observed |
| 2 | 70% | none | 0% | none | observed |
| 3 | 78% | none | 0% | none | none |
| 4 | 80% | none | 0% | none | none |
| 5 | 78% | none | 0% | none | none |
| 6 | 80% | none | 0% | none | none |
| 7 | 65% | observed | 1% | observed | observed |
| 8 | 60% | observed | 2% | observed | observed |

Figure in parentheses indicates pulse numbers.

Table 1 demonstrates that a calcium fluoride crystal having an internal transmittance of 70% or more is not colored and has a 0% decreased transmittance, and so is preferably applicable to an optical system for a KrF or ArF excimer laser. Durability of the calcium fluoride crystal having 70% or 80% internal transmittance is further improved.

EXAMPLE 2

A series of calcium fluoride crystals having various strontium fluoride contents was produced as in Example 1. Coloring and decreased transmittance for each strontium content were investigated. The results are summarized in Table 2.

TABLE 2

| Sample No. | Sr content ppm | Coloring ($10^4$) | Decreased Transmittance | Coloring ($10^7$) |
| --- | --- | --- | --- | --- |
| St-1 | 700 | observed | 2% | observed |
| St-2 | 600 | none | 0% | observed |
| St-3 | 380 | none | 0% | none |
| St-4 | 200 | none | 0% | none |
| St-5 | 100 | none | 0% | none |
| St-6 | 20 | none | 0% | none |
| St-7 | 1 | none | 0% | observed |
| St-8 | <0.5 | observed | 1% | observed |

Figure in parentheses indicates pulse numbers.

Table 2 illustrates that a calcium fluoride crystal containing strontium within a range of 1 to 600 ppm has a 0% decreased transmittance and excellent durability to al KrF or ArF excimer laser. A calcium fluoride crystal containing strontium within a range of 20 to 40 ppm exhibits further improved durability.

EXAMPLE 3

Each internal transmittance, coloring, decreased transmittance and EFD of calcium fluoride crystals having various strontium contents were evaluated. Results are shown in Table 3.

TABLE 3

| Sample No. | Internal Transmittance | Sr content ppm | Coloring ($10^7$) | Decreased Transmittance | EPD |
| --- | --- | --- | --- | --- | --- |
| St-9 | 75 | 400 | none | 0% | $10^4$ |
| St-10 | 80 | 100 | none | 0% | $10^4$ |
| St-11 | 80 | 20 | none | 0% | $10^4$ |
| St-12 | 70 | 1 | none | 0% | $10^5$ |

Figure in parentheses indicates pulse numbers.

Table 3 demonstrates that a calcium fluoride crystal containing 20 to 400 ppm of strontium exhibits excellent characteristics, particularly, decreased transmittance and EPD, and thus excellent durability to an excimer laser.

EXAMPLE 4

Calcium fluoride powder was prepared by the reaction of calcium carbonate with a hydrofluoric acid. A $ZnF_2$ scavenger in an amount of 0.7 wt % was mixed with the powder. The mixture was placed into a crucible in a purification furnace, heated to 1,390 to 1,450° C., and cooled by lowering the crucible to crystallize the calcium fluoride. The top layer of the calcium fluoride crystal was removed by several millimeters. The heating, slow cooling and removing steps were repeated a number of times to prepare various calcium fluoride crystal blocks having been heated, cooled and purified a different number of times.

Each block, as well as aluminum fluoride, was placed into the crucible in the single-crystal growing furnace. The aluminum amounts were varied. ZnF$_2$ was added in an amount of 0.1 wt % as a scavenger. The crucible was heated to 1,390 to 1,450° C. while the furnace was evacuated to 6×10$^{-4}$ Torr or less. Then, the crucible was further evacuated to 2×10$^{-6}$ Torr or less at a temperature of 1,390 to 1,450° C. for 11 hours. The crucible was lowered at a rate of 2 mm/hour. The crucible was cooled at a cooling rate of approximately 100° C./min thereby.

The calcium fluoride single-crystal was placed into a crucible in an annealing furnace with 0.1 wt % of ZnF$_2$. The annealing furnace was heated from room temperature to 900° C. at a heating rate of 100° C./min. while evacuating the furnace, maintained at 900° C. for 20 hours, and cooled to room temperature at a cooling rate of 6° C./min.

Coloring and decreased transmittance of each calcium fluoride crystal were observed.

After 1×10$^4$ pulses of laser beam irradiation having an output power of 30 ml/cm$^2$ and 1-hour of γ-ray irradiation at 1×10$^4$ R/H, the decreased transmittances for 193 and 248 nm wavelength light were determined by coloring observation. Coloring after 10$^7$ pulses of laser irradiation was also observed. Results are shown in Table 4.

TABLE 4

| Sample No. | Al Content (ppm) | Coloring (10$^4$) | Decreased Transmittance | Coloring (10$^7$) |
|---|---|---|---|---|
| Al-1 | 100 | observed | 2% | observed |
| Al-2 | 50 | none | 0% | observed |
| Al-3 | 20 | none | 0% | observed |
| Al-4 | 10 | none | 0% | observed |
| Al-5 | 5 | none | 0% | none |
| Al-6 | 2 | none | 0% | none |
| Al-7 | 1 | none | 0% | none |
| Al-8 | <0.5 | none | 1% | observed |

Figure in parentheses indicates pulse numbers.

Table 4 demonstrates that a calcium fluoride crystal containing aluminum in a range of 1 to 50 ppm has a 0% decreased transmittance, and exhibits excellent durability to a KrF or ArF excimer laser. Durability of a calcium fluoride crystal containing 1 to 5 ppm of aluminum is further improved.

EXAMPLE 5

Each internal transmittance, coloring, decreased transmittance and EPD (etch pit density) of calcium fluoride crystals having various aluminum contents were evaluated. Results are shown in Table 5.

TABLE 5

| Sample No | Internal Transmittance | Al content (ppm) | Coloring (10$^7$) | Decreased Transmittance | EPD |
|---|---|---|---|---|---|
| Al-9 | 75 | 5 | none | 0% | 10$^4$ |
| Al-10 | 80 | 2 | none | 0% | 10$^4$ |
| Al-11 | 80 | 1 | none | 0% | 10$^4$ |

Figure in parentheses indicates pulse numbers.

Table 5 demonstrates that a calcium fluoride crystal containing 1 to 5 ppm of aluminum exhibits excellent characteristics, particularly decreased transmittance and EPD, and thus excellent durability to an excimer laser.

By shaping the single-crystal in Al-9, an optical part (lens) was prepared, an excimer laser optical system was fabricated, and an exposure apparatus using an excimer laser for photo-lithography was assembled. A fine pattern of less than 0.25 μm was exposed using 135-nm wavelength light. Photoresist patterning could be stably performed for long time periods compared with conventional processes.

EXAMPLE 6

Calcium fluoride powder was prepared by the reaction of calcium carbonate with a hydrofluoric acid. A ZnF$_2$ scavenger in an amount of 0.7 wt % was mixed with the powder. The mixture was placed into a crucible in a purification furnace, heated to 1,390 to 1,450° C., and gradually cooled by lowering the crucible to crystallize the calcium fluoride. The top layer of the calcium fluoride crystal was removed by several millimeters. The heating, slow cooling and removing steps were repeated a number of times to prepare various calcium fluoride crystal blocks having beenl heated, cooled and purified a different number of times.

Each block and silicon were placed into the crucible in the single-crystal growing furnace. The aluminum amounts were varied. ZnF$_2$ was added in an amount of 0.1 wt % as a scavenger. The crucible was heated to 1,390 to 1,450° C. while the furnace was evacuated to 6×10$^{-4}$ Torr or less. Then, the crucible was further evacuated to 2×10$^{-6}$ Torr or less at a temperature of 1,390 to 1,450° C. for 11 hours. The crucible was lowered at a rate of 2 mm/hour. The crucible was cooled at a cooling rate of approximately 100° C./min thereby.

The calcium fluoride single-crystal was placed into a crucible in an annealing furnace with 0.1 wt % of ZnF$_2$. The annealing furnace was heated from room temperature to 900° C. at a heatingrate of 100° C./min. while evacuating the furnace, maintained at 900° C. for 20 hours, and cooled to room temperature at a cooling rate of 6° C./min.

Coloring and decreased transmittance of each calcium fluoride crystal were observed.

After 1×10$^4$ pulses of laser beam irradiation having an output power of 30 ml/cm$^2$ and 1-hour of γ-ray irradiation at 1×10$^4$ R/H, the decreased transmittances for 193 and 248 nm wavelength light were determined by coloring observation. Coloring after 10$^7$ pulses of laser irradiation was also observed. Results are shown in Table 6.

TABLE 6

| Sample No. | Si Content (ppm) | Coloring (10$^4$) | Decreased Transmittance | Coloring (10$^7$) |
|---|---|---|---|---|
| Si-1 | 100 | observed | 2% | observed |
| Si-2 | 50 | none | 0% | observed |
| Si-3 | 20 | none | 0% | observed |
| Si-4 | 10 | none | 0% | observed |
| Si-5 | 5 | none | 0% | none |
| Si-6 | 2 | none | 0% | none |
| Si-7 | 1 | none | 0% | none |
| Si-6 | <0.5 | none | 1% | observed |

Figure in parentheses indicates pulse numbers.

Table 6 demonstrates that a calcium fluoride crystal containing silicon in a range of 1 to 50 ppm has a 0% decreased transmittance, and exhibits excellent durability to a KrF or ArF excimer laser.

EXAMPLE 7

Each internal transmittance, coloring, decreased transmittance and EPD (etch pit density) of calcium fluoride crystals having various silicon contents were evaluated. Results are shown in Table 7.

TABLE 7

| Sample No. | Internal Transmittance | Si content (ppm) | Coloring ($10^7$) | Decreased Transmittance | EPD |
|---|---|---|---|---|---|
| Si-9 | 75 | 5 | none | 0% | $10^4$ |
| Si-10 | 80 | 2 | none | 0% | $10^4$ |
| Si-11 | 80 | 1 | none | 0% | $10^4$ |

Figure in parentheses indicates pulse numbers.

Table 7 demonstrates that a calcium fluoride crystal containing 1 to 5 ppm of aluminum exhibits excellent characteristics, particularly decreased transmittance and EPD, and thus excellent durability to an excimer laser.

By shaping the single-crystal in Si-9, an optical part (lens) was prepared, an excimer laser optical system was fabricated, and an exposure apparatus using an excimer laser for photolithography was assembled. A fine pattern of less than 0.25 μm was exposed using 135-nm wavelength light. Photoresist patterning could be stably performed for long time periods compared with conventional processes.

EXAMPLE 8

Calcium fluoride powder was prepared by the reaction of calcium carbonate with a hydrofluoric acid. A $ZnF_2$ scavenger in an amount of 0.7 wt % was mixed with the powder. Magnesium fluoride was added to the mixture. The mixture was placed into a crucible in a purification furnace, heated to 1,390 to 1,450° C., and gradually cooled by lowering the crucible to crystallize the calcium fluoride. The top layer of the calcium fluoride crystal was removed by several millimeters. The heating, slow cooling and removing steps were repeated a number of times to prepare various calcium fluoride crystal blocks having been heated, cooled and purified a different number of times.

Each block was placed into the crucible in the single-crystal growing furnace. $ZnF_2$ was added in an amount of 0.1 wt % as a scavenger. The crucible was heated to 1,390 to 1,450° C. while the furnace was evacuated to $6\times10^{-4}$ Torr or less. Then, the crucible was further evacuated to $2\times10^{-6}$ Torr or less at a temperature of 1,390 to 1,450° C. for 11 hours. The crucible was lowered at a rate of 2 mm/hour. The crucible was cooled at a cooling rate of approximately 100° C./min thereby.

The calcium fluoride single-crystal was placed into a crucible in an annealing furnace with 0.1 wt % of $ZnF_2$. The annealing furnace was heated from room temperature to 900° C. at a heating rate of 100° C./min. while evacuating the furnace, maintained at 900° C. for 20 hours, and cooled to room temperature at a cooling rate of 6° C./min.

Coloring and decreased transmittance of each calcium fluoride crystal were observed.

After $1\times10^4$ pulses of laser beam irradiation having an output power of 30 ml/cm² and 1-hour of γ-ray irradiation at $1\times10^4$ R/H, the decreased transmittance for 193 and 248 nm wavelength light were determined by coloring observation. Coloring after $10^7$ pulses of laser irradiation was also observed. Results are shown in Table 8.

TABLE 8

| Sample No. | Mg Content (ppm) | Coloring ($10^4$) | Decreased Transmittances | Coloring ($10^7$) |
|---|---|---|---|---|
| Mg-1 | 20 | observed | 2% | observed |
| Mg-2 | 10 | none | 0% | observed |
| Mg-3 | 8 | none | 0% | observed |
| Mg-4 | 6 | none | 0% | observed |

TABLE 8-continued

| Sample No. | Mg Content (ppm) | Coloring ($10^4$) | Decreased Transmittances | Coloring ($10^7$) |
|---|---|---|---|---|
| Mg-5 | 3 | none | 0% | none |
| Mg-6 | 1 | none | 0% | none |
| Mg-7 | <0.5 | none | 1% | observed |

Figure in parentheses indicates pulse numbers.

Table 8 demonstrates that a calcium fluoride crystal containing magnesium in a range of 1 to 10 ppm has a 0% decreased transmittance, and exhibits excellent durability to an KrF or ArP excimer laser.

EXAMPLE 9

Each internal transmittance, coloring, decreased transmittance and EPD (etch pit density) of calcium fluoride crystals having various magnesium contents were evaluated. Results are shown in Table 9.

TABLE 9

| Sample No. | Internal Transmittance | Mg content (ppm) | Coloring ($10^7$) | Decreased Transmittance | EPD |
|---|---|---|---|---|---|
| Mg-8 | 75 | 10 | none | 0% | $10^5$ |
| Mg-9 | 80 | 6 | none | 0% | $10^4$ |
| Mg-10 | 80 | 3 | none | 0% | $10^4$ |
| Mg-11 | 70 | 1 | none | 0% | $10^4$ |

Figure in parentheses indicates pulse numbers.

Table 9 demonstrates that a calcium fluoride crystal containing 1 to 5 ppm of magnesium exhibits excellent characteristics, particularly decreased transmittance and EPD, and thus excellent durability to an excimer laser.

By shaping the single-crystal in Mg-9, an optical part (lens) was prepared, an excimer laser optical system was fabricated, and an exposure apparatus using an excimer laser for photo-lithography was assembled. A fine pattern of less than 0.25 μm was exposed using 135-nm wavelength light. Photoresist patterning could be stably performed for long time periods compared with conventional processes.

EXAMPLE 10

Calcium fluoride powder was prepared by pulverizing raw calcium fluoride containing large amounts of impurities, i.e., 12 wpm of yttrium and 5 ppm of lanthanum. The calcium fluoride powder was mixed with 0.7 wt % of $ZnF_2$. After the mixture was heated to 1,360° C. in a crucible in the purification furnace, it was gradually cooled by lowering the crucible. The top layer of the calcium fluoride single-crystal was removed by several millimeters. The heating, slow cooling and removing steps were repeated a number of times to prepare various calcium fluoride crystal blocks having being heated, cooled and purified a different number of times.

Each block was placed into the crucible in the single-crystal growing furnace with silicon. $ZnF_2$ was added in an amount of 0.1 wt % as a scavenger. The crucible was heated to 1,360° C. while the furnace was evacuated to $6\times10^{-4}$ Torr or less. Then, the crucible was further evacuated to $2\times10^{-6}$ Torr or less at 1,360° C. for 11 hours. The crucible was lowered at a rate of 2 mm/hour. The crucible was cooled at a cooling rate of approximately 100° C./min thereby.

The calcium fluoride single-crystal was placed into a crucible in an annealing furnace with 0.1 wt % of $ZnF_2$. The annealing furnace was heated from room temperature to 900° C. at a heating rate of 100° C./min. while evacuating the furnace, maintained at 900° C. for 20 hours, and cooled to room temperature at a cooling rate of 6° C./min.

Table 10 includes data of internal transmittance, Y and La contents of each calcium fluoride crystal.

TABLE 10

| Sample No. | La Content (ppm) | Y Content (ppm) | EPD | Coloring | Decreased Transmittance |
|---|---|---|---|---|---|
| La,Y-1 | 5 | 11 | $10^6$ | observed | 3% |
| La,Y-2 | 1 | 10 | $10^4$ | none | 0% |
| La,Y-3 | 1 | 3 | $10^4$ | none | 0% |
| La,Y-4 | 0.5 | 1 | $10^4$ | none | 0% |

Figure in parentheses indicates pulse numbers.

Table 8 demonstrates that each calcium fluoride crystal containing 1 ppm or less of La and 10 ppm or less of Y has an internal transmittance of 70% or more, and a 0% decreased transmittance, and is preferably applicable to an optical system for a KrF or ArF excimer laser.

EXAMPLE 11

Various amounts of $AlF_3$, $SrF_2$, $MgF_2$, Si and $ZnF_2$ were added in the purification step. Other conditions were the same as in Example 1. The ranges of the impurity contents of the resulting calcium fluoride crystal are summarized in Table 11.

TABLE 11

| Impurity | Content (ppm) |
|---|---|
| La | 0.3 to 2 |
| Y | 1 to 10 |
| Sr | 1 to 400 |
| Al | 1 to 10 |
| Si | 1 to 10 |
| Mg | 1 to 5 |
| C | <20 |
| O | <20 |
| Ce | <1 |
| Fe | <1 |
| Pb | <1 |

Table 11 demonstrates that since the Sr, Al, Si and Mg contents are limited to the specified ranges in accordance with the present invention, the oxygen and carbon contents can be reduced to 25 ppm or less and Ce, Fe and Pb contents can be reduced to 1 ppm or less without repetition of the purification step.

While the present invention has been described with reference to what are presently considered to be the preferred embodiments, it is to be understood that the invention in not limited to the disclosed embodiments To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A calcium fluoride crystal containing strontium, the strontium content ranging from 1 ppm to 600 ppm.

2. A calcium fluoride crystal containing strontium, the strontium content ranging from 1 ppm to 600 ppm, and said calcium fluoride crystal having an internal transmittance of 70% or more for light of a 135-nm wavelength or more.

3. An optical lens having a high transmittance of laser beams from excimer lasers and a high durability against the laser beams, said optical lens comprising a calcium fluoride crystal having an internal transmittance of 70% or more for light of a a 135-nm wavelength or more.

4. An optical lens according to claim 3, wherein said optical element is provided with an antireflection coating.

5. An optical lens for excimer lasers comprising a lens of a calcium fluoride crystal containing strontium, the strontium content ranging from 1 ppm to 600 ppm, and said calcium fluoride crystal having an internal transmittance of 70% or more for light of a 135-nm wavelength or more.

6. An optical element according to claim 5, wherein said optical element is provided with an antireflection coating.

7. A method of making a calcium fluroide single crystal, the crystal having a high transmittance of laser beams and a high durability against the laser beams, the crystal having an internal transmittance of 70% or more for light of a 135-nm wavelenght or more, said method comprising the steps of:
  mixing a raw calcium fluoride with a scavenger so as to become a mixture;
  melting said mixture; and
  cooling said mixture to obtain said calcium fluoride single crystal.

8. An exposure apparatus for photolithography comprising:
  an optical system comprising a lens of a calcium fluoride crystal, the lens having a high transmittance of laser beams and a high durability against the laser beams, the crystal having an internal transmittance of 70% or more for light of a a 135-nm wavelength or more; and
  a stage for holding a substrate being exposed.

9. An exposure apparatus for photo-lithography comprising an optical system comprising a lens of a calcium fluoride crystal containing strontium and a stage for holding a substrate being exposed, the strontium content ranging from 1 ppm to 600 ppm, and said calcium fluoride crystal having an internal transmittance of 70% or more for light of a 135-nm wavelength or more.

10. A calcium fluoride crystal containing aluminum, the aluminum content being 50 ppm or less, and said calcium fluoride crystal having an internal transmittance of 70% or more for light of a 135-nm wavelength or more.

11. A calcium fluoride crystal according to claim 10, wherein said aluminum content ranges from 1 ppm to 50 ppm.

12. A calcium fluoride crystal according to claim 10, wherein said aluminum content ranges from 1 ppm to 5 ppm.

13. An optical element for excimer lasers comprising a calcium fluoride crystal containing aluminum, the aluminum content being 50 ppm or less, wherein the internal transmittance of said calcium fluoride crystal is 70% or more for light of a 135-nm wavelength or more.

14. An optical element according to claim 13, wherein said optical element is provided with an antireflection coating.

15. An exposure apparatus for photo-lithography comprising an optical system comprising a lens of a calcium fluoride crystal containing aluminum and a stage for holding a substrate being exposed, the aluminum content being 50 ppm or less, and said calcium fluoride crystal having an internal transmittance of 70% or more for light of a 135-nm wavelength or more.

16. A calcium fluoride crystal containing silicon, the silicon content being 50 ppm or less, and said calcium fluoride crystal having an internal transmittance of 70% or more for light of a 135-nm wavelength or more.

17. A calcium fluoride crystal according to claim 16, wherein said silicon content ranges from 1 ppm to 50 ppm.

18. A calcium fluoride crystal according to claim 16, wherein said silicon content ranges from 1 ppm to 5 ppm.

19. An optical element for excimer lasers comprising a calcium fluoride crystal containing silicon, the silicon content being 50 ppm or less, wherein the internal transmittance of said calcium fluoride crystal is 70% or more for light of a 135-nm wavelength or more.

20. An optical element according to claim 19, wherein said optical element is provided with an antireflection coating.

21. An exposure apparatus for photo-lithography comprising an optical system comprising a lens of a calcium fluoride crystal containing silicon and a stage for holding a substrate being exposed, the silicon content being 50 ppm or less, and said calcium fluoride crystal having an internal transmittance of 70% or more for light of a 135-nm wavelength or more.

22. A calcium fluoride crystal containing magnesium, the magnesium content ranging from 1 ppm to 10 ppm, and said calcium fluoride crystal having an internal transmittance of 70% or more for light of a 135-nm wavelength or more.

23. An optical element for excimer lasers comprising a calcium fluoride crystal containing magnesium, the magnesium content ranging from 1 ppm to 10 ppm, wherein the internal transmittance of said calcium fluoride crystal is 70% or more for light of a 135-nm wavelength or more.

24. An optical element according to claim 23, wherein said optical element is provided with an antireflection coating.

25. An exposure apparatus for photo-lithography comprising an optical system comprising a lens of a calcium fluoride crystal containing magnesium and a stage for holding a substrate being exposed, the magnesium content ranging from 1 ppm to 10 ppm, and said calcium fluoride crystal having an internal transmittance of 70% or more for light of a 135-nm wavelength or more.

26. A calcium fluoride crystal having an internal transmittance of 70% or more for light of a 135-nm wavelength or more and containing lanthanum (La) and yttrium (Y), the lanthanum content being 1 ppm or less and the yttrium content being 10 ppm or less.

27. A calcium fluoride crystal according to claim 26, wherein said calcium fluoride crystal further contains at least one element selected from the group consisting of strontium (Sr), aluminum (Al), silicon (Si) and magnesium (Mg).

28. A calcium fluoride crystal according to either of claim 26 or claim 27, wherein said calcium fluoride crystal has an etch pit density of $10^4$ or less.

29. An optical part for excimer lasers comprising a calcium fluoride crystal having an internal transmittance of 70% or more for light of a 135-nm wavelength or more, and containing lanthanum (La) and yttrium (Y), the lanthanum content being 1 ppm or less and the yttrium content being 10 ppm or less.

30. An optical element according to claim 29, wherein said optical element is provided with an antireflection coating.

31. An exposure apparatus for photo-lithography comprising an optical system comprising a lens of a calcium fluoride crystal having an internal transmittance of 70% or more for light of a 135-nm wavelength or more and containing lanthanum (La) and yttrium (Y), and a stage for holding a substrate being exposed, the lanthanum content being 5 ppm or less and the yttrium content being 10 ppm or less.

32. An exposure apparatus comprising:

an illuminating light source;

a stage for placing an exposed member; and a plurality of optical articles provided in a light optical system and/or a projection optical system, at least one of said optical articles comprising a lens of calcium fluoride crystal, the lens having a high transmittance of laser beams and a high durability against the laser beams, the crystal having an internal transmittance of 70% or more for light of 135-nm wavelength or more.

33. A method according to claim 7, wherein said calcium fluoride crystal has lanthanum (La) being 1 ppm or less and yttrium being 10 ppm or less.

34. A method of making a calcium fluoride crystal according to claim 33, wherein a step for mixing melting and cooling calcium fluoride crystal a a scavenger is repeated at least twice.

35. A method of making a calcium fluoride crystal according to claim 34, wherein said scavenger is zinc fluoride.

36. A method of making a calcium fluoride crystal according to claim 34, wherein said scavenger is bismuth fluoride.

37. A method of making a calcium fluoride crystal according to claim 34, wherein said scavenger is sodium fluoride.

38. A method of making a calcium fluoride crystal according to claim 34, wherein said scavenger in lithium fluoride.

39. A method according to claim 33, wherein said calcium fluoride crystal has strontium from 1 ppm to 600 ppm.

40. A method according to claim 33, wherein said calcium fluoride crystal has aluminum being 50 ppm or less.

41. A method according to claims 33, wherein said calcium fluoride crystal has silicon being 50 ppm or less.

42. A method according to claim 33, wherein said calcium fluoride crystal has magnesium ranging from 1 ppm to 10 ppm.

* * * * *

UNITED STATES PATENT AND TRADEMARK OFFICE
CERTIFICATE OF CORRECTION

PATENT NO. : 6,342,312 B2
DATED : January 29, 2002
INVENTOR(S) : Oba et al.

It is certified that error appears in the above-identified patent and that said Letters Patent is hereby corrected as shown below:

<u>Title page,</u>
ABSTRACT,
Line 19, "System" should read -- system --.

<u>Column 4,</u>
Line 11, "article" should read -- articles --.

<u>Column 9,</u>
Line 5, "maybe" should read -- may be --.
Line 6, "Gssion" should read -- emission --.
Line 14, "causer" should read -- causes --.

<u>Column 10,</u>
Line 48, "shaped,into" should read -- shaped into --.

<u>Column 13,</u>
Line 31, "2 nm/hour." should read -- 2 mm/hour."

<u>Column 16,</u>
Line 16, "beenl" should read -- been --.
Line 31, "heatingrate" should read -- heating rate --.

<u>Column 18,</u>
Line 48, "12 wpm" should read -- 12 ppm --.
Line 56, "being" should read -- been --.

<u>Column 19,</u>
Line 64-65, "1. A calcium fluoride crystal containing strontium, the strontium content ranging from 1 ppm to 600 ppm." should be deleted. The remaining claims should be renumbered accordingly.

UNITED STATES PATENT AND TRADEMARK OFFICE
CERTIFICATE OF CORRECTION

PATENT NO. : 6,342,312 B2
DATED : January 29, 2002
INVENTOR(S) : Oba et al.

It is certified that error appears in the above-identified patent and that said Letters Patent is hereby corrected as shown below:

Column 20,
Line 33, the second occurrence of "a" should be deleted.

Column 22,
Line 33, "claim 33," should read -- claim 7, -- and "mixing" should read -- mixing, --.
Line 34, the first occurrence of "a" should read -- and --.
Line 43, "in" should read -- is --.

Signed and Sealed this

Eleventh Day of June, 2002

Attest:

JAMES E. ROGAN
Attesting Officer  Director of the United States Patent and Trademark Office